United States Patent
Takahashi et al.

(10) Patent No.: US 11,784,054 B2
(45) Date of Patent: Oct. 10, 2023

(54) ETCHING METHOD AND SUBSTRATE PROCESSING SYSTEM

(71) Applicant: TOKYO ELECTRON LIMITED, Tokyo (JP)

(72) Inventors: Nobuhiro Takahashi, Nirasaki (JP); Kazuhito Miyata, Nirasaki (JP); Yasuo Asada, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 255 days.

(21) Appl. No.: 17/022,777

(22) Filed: Sep. 16, 2020

(65) Prior Publication Data

US 2021/0082710 A1 Mar. 18, 2021

(30) Foreign Application Priority Data

Sep. 18, 2019 (JP) ................................. 2019-169709

(51) Int. Cl.
*H01L 21/02* (2006.01)
*H01L 21/306* (2006.01)
*H01J 37/32* (2006.01)

(52) U.S. Cl.
CPC .. *H01L 21/30604* (2013.01); *H01J 37/32357* (2013.01); *H01L 21/02057* (2013.01); *H01L 21/02087* (2013.01); *H01J 2237/335* (2013.01)

(58) Field of Classification Search
CPC ......... H01L 21/30604; H01L 21/02057; H01L 21/02087; H01J 37/32357; H01J 2237/335
See application file for complete search history.

(56) References Cited

U.S. PATENT DOCUMENTS

| 10,763,177 B1* | 9/2020 | Zhang ................. H01L 29/0673 |
| 2004/0242015 A1* | 12/2004 | Kim .................. H01L 21/30604 252/79.1 |
| 2007/0042570 A1* | 2/2007 | Dip ..................... H01L 21/0245 257/E21.293 |
| 2008/0176385 A1* | 7/2008 | Kato ................. H01L 21/30604 438/479 |
| 2013/0026479 A1* | 1/2013 | Kawashima ...... H01L 29/66765 438/479 |
| 2014/0011339 A1* | 1/2014 | Zheng ............... H01L 21/02057 438/715 |
| 2016/0035581 A1* | 2/2016 | Posseme ............... H01L 21/306 438/705 |
| 2016/0365440 A1* | 12/2016 | Suk .................... H01L 29/0673 |
| 2017/0350038 A1* | 12/2017 | Lo .................... H01L 21/02046 |

(Continued)

FOREIGN PATENT DOCUMENTS

| JP | H01-92385 A | 4/1989 |
| JP | 2009-510750 A | 3/2009 |

(Continued)

*Primary Examiner* — Ali Naraghi
*Assistant Examiner* — Siangluai Mang
(74) *Attorney, Agent, or Firm* — Fenwick & West LLP

(57) ABSTRACT

An etching method for performing side-etching of silicon germanium layers of a substrate having alternating silicon layers and the silicon germanium layers formed thereon is provided. The method includes modifying surfaces of residuals by supplying a plasmarized gas containing hydrogen to the residuals on exposed end surfaces of the silicon germanium layers, and performing side-etching on the silicon germanium layers by supplying a fluorine-containing gas to the silicon germanium layers.

19 Claims, 6 Drawing Sheets

(56) References Cited

U.S. PATENT DOCUMENTS

| | | | |
|---|---|---|---|
| 2018/0190537 A1* | 7/2018 | Li | H01L 21/0332 |
| 2019/0157138 A1* | 5/2019 | Cheng | H01L 21/76256 |
| 2020/0027791 A1* | 1/2020 | Loubet | H01L 29/165 |
| 2020/0058653 A1* | 2/2020 | Chiang | H01L 29/24 |
| 2020/0105617 A1* | 4/2020 | Wang | H01L 29/66772 |
| 2020/0287023 A1* | 9/2020 | Loubet | H01L 29/16 |
| 2020/0312658 A1* | 10/2020 | Miura | H01L 29/1054 |
| 2020/0312951 A1* | 10/2020 | Xu | H01L 29/0673 |
| 2021/0082710 A1* | 3/2021 | Takahashi | H01L 21/02057 |
| 2021/0328013 A1* | 10/2021 | Ando | H01L 29/66545 |

FOREIGN PATENT DOCUMENTS

| | | |
|---|---|---|
| JP | 2018170380 A | 11/2018 |
| KR | 10-2018-0112869 A | 10/2018 |
| WO | WO 2017/151958 A1 | 9/2017 |

\* cited by examiner

FIG.4

| RESIDUAL | DRY | WET |
|---|---|---|
| C | O*、H* | SPM |
| CF | O*、H* | FPM |
| O | BT、H* | DHF |
| Br | H* | — |
| Cl | H* | DIW |
| etc | — | — |

FIG.6

| | (a) | (b) |
|---|---|---|
| ETCHING [Cycle] | 7 | 3 |
| SHAPE | | |
| EA [nm] | 10.1 | 30.1 |
| LOADING [%] | 23.6 | 8.6 |

ETCHING METHOD AND SUBSTRATE PROCESSING SYSTEM

CROSS-REFERENCE TO RELATED APPLICATIONS

This application claims priority to Japanese Patent Application No. 2019-169709, filed on Sep. 18, 2019, the entire contents of which are incorporated herein by reference.

TECHNICAL FIELD

The present disclosure relates to an etching method and a substrate processing system.

BACKGROUND

Japanese Patent Application Publication No. 2009-510750 discloses a method of accelerating etching of silicon using $ClF_3$ or $XeF_2$ as an etching gas without plasma. In accordance with the method disclosed in Japanese Patent Application Publication No. 2009-510750, a substrate is converted into a composite semiconductor by introducing germanium into a silicon layer on the substrate, and an etching is performed by the etching gas.

Japanese Patent Application Publication No. H01-92385 discloses a microfabrication method for a member made of a metallic material or a composite thereof, in which a reactive gas for fabrication contains at least one of ClF, $ClF_3$, or $ClF_5$. In accordance with the method disclosed in Japanese Patent Application Publication No. H01-92385, an etching in a manufacturing process of a semiconductor integrated circuit can be performed at a high processing speed in a simple way.

The technique of the present disclosure appropriately performs side etching of a silicon germanium layer.

SUMMARY

In accordance with an aspect of the present disclosure, there is provided an etching method for performing side-etching of silicon germanium layers of a substrate having alternating silicon layers and the silicon germanium layers formed thereon, the etching method including: modifying surfaces of residuals by supplying a plasmarized gas containing hydrogen to the residuals on exposed end surfaces of the silicon germanium layers; and performing side-etching on the silicon germanium layers by supplying a fluorine-containing gas to the silicon germanium layers.

BRIEF DESCRIPTION OF THE DRAWINGS

The objects and features of the present disclosure will become apparent from the following description of embodiments, given in conjunction with the accompanying drawings, in which:

FIG. 4 is a table showing an example of residuals remaining after the pre-treatment.

FIG. 6 explains an example of a state of a wafer after side etching; and

DETAILED DESCRIPTION

In a semiconductor device, a silicon-containing film is widely and variously used.

For example, a silicon germanium (SiGe) film or a silicon (Si) film is used as a gate electrode or a seed layer. Further, in a semiconductor device manufacturing process, Si nanowires (NW) are formed by alternately laminating the SiGe film and the Si film on a substrate and selectively side-etching only the SiGe film.

The techniques disclosed in Japanese Patent Application Publication No. 2009-510750 and Japanese Patent Application Publication No. H1-92385 are methods for performing side etching of the SiGe film. For example, in accordance with the etching method disclosed in Japanese Patent Application Publication No. 2009-510750, a silicon is converted into a composite semiconductor (SiGe layer) by introducing germanium into an Si layer on the substrate, and etching is performed using, e.g., $ClF_3$. Further, in accordance with the etching method disclosed in Japanese Patent Application Publication No. H1-92385, a member made of a metallic material such as Si or the like is etched using, e.g., a reactive gas containing $ClF_3$.

Figure 1:
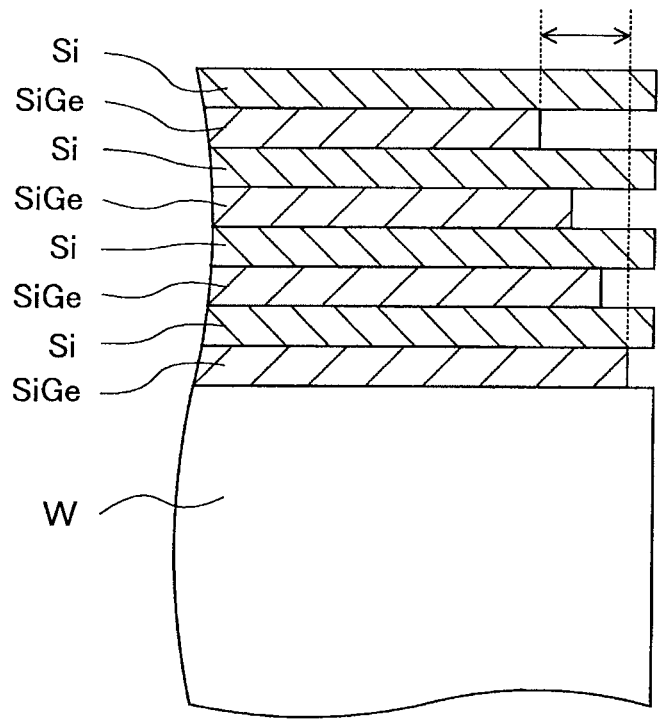
FIG. 1 explains an example of occurrence of loading.

In the side etching of an alternating multi-stacked SiGe films, it is required to control etching amount of each SiGe film to be uniform. However, as shown in FIG. 1, a loading may occur in which the etching amount of each SiGe film is not uniform. It is considered that the loading is due to formation of damaged layers or residuals (deposits) caused by reactive ion etching (RIE) which is a pre-treatment of the side etching of the SiGe film. The RIE will be described later.

However, the loading is not disclosed in Japanese Patent Application Publication No. 2009-510750 and Japanese Patent Application Publication No. H1-92385. In other words, the conventional side etching method needs to be improved.

The technique of the present disclosure appropriately performs a side etching of a silicon germanium layer. Hereinafter, a wafer processing system as a substrate processing system and a wafer processing method in accordance with the present embodiment will be described with reference to the drawings. In this specification and the drawings, like reference numerals will be given to like parts having substantially the same configurations and functions, and redundant description thereof will be omitted.

<Pre-Treatment of Side Etching of SiGe Films>

First, the RIE processing as the above-mentioned pre-treatment will be described.

Figures 2A, 2B:
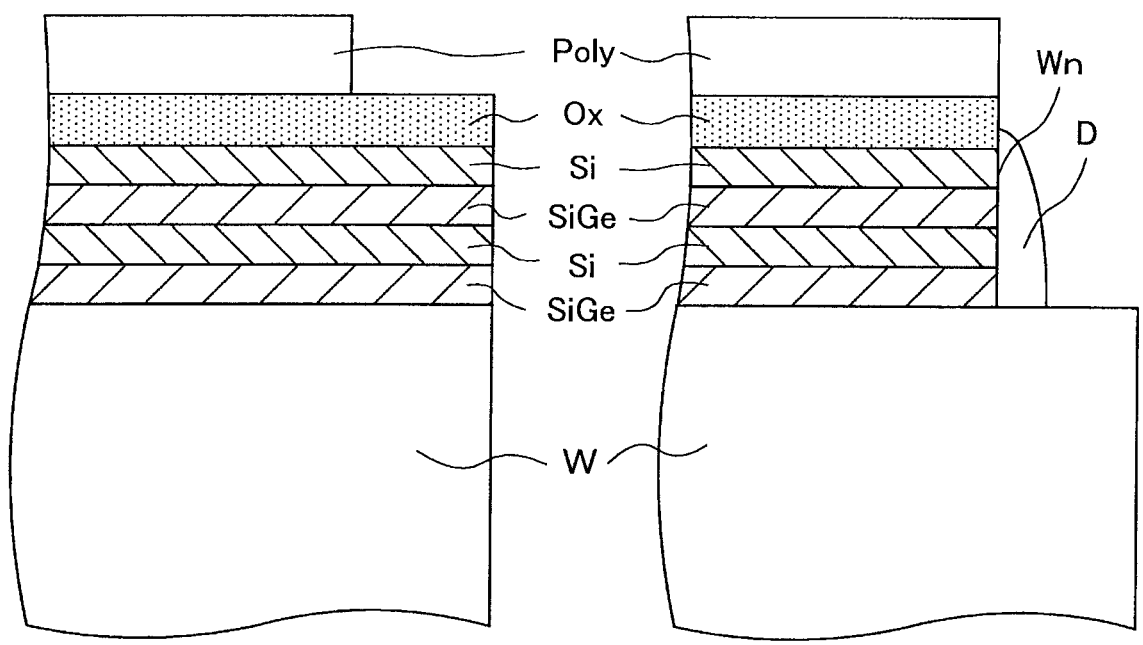
FIGS. 2A and 2B explain an example of a state of pre-treatment.

As described above, in the side etching of the SiGe films, the RIE processing is performed, as a pre-treatment of such side etching, on the Si/SiGe layers alternatingly stacked on a wafer W and on an oxide film layer Ox formed on the surface of the Si/SiGe layers as shown in FIG. 2A. In the RIE processing, an etching process for exposing side surfaces (hereinafter, referred to as "arrangement surfaces Wn") of the SiGe/Si layers is performed as shown in FIG. 2B. In the RIE processing, HBr, $Cl_2$, He, and $O_2$ ($CF_4$) are supplied, for example, to the SiGe/Si layers formed on the wafer W. $CF_4$, for example, is supplied to the oxide film layer Ox formed on the surface of the Si/SiGe layers.

In the RIE processing, the arrangement surface Wn is cleaned after the etching of the Si/SiGe layers and the oxide film layer Ox. However, residuals (deposits) D that cannot be removed by the cleaning remain on the arrangement surface Wn as shown in FIG. 2B. The residuals D may include, e.g., carbon (C), hydrogen fluoride (CF), oxide (O), bromine (Br), chlorine (Cl), and the like.

When the residuals D remain on the arrangement surface Wn, an etching gas may be blocked by the residuals D during the subsequent side etching of the SiGe films and, thus, the SiGe films may not be appropriately etched. In other words, it is considered that the etching gas is not uniformly supplied to each SiGe layer due to the residuals D remaining on the arrangement surface Wn, which causes the above-described loading.

In the wafer processing system according to the technique of the present disclosure, the loading that may occur by the blockage of the etching gas to the SiGe films can be improved by appropriately removing the residuals D.

<Wafer Processing System>

Figure 3:
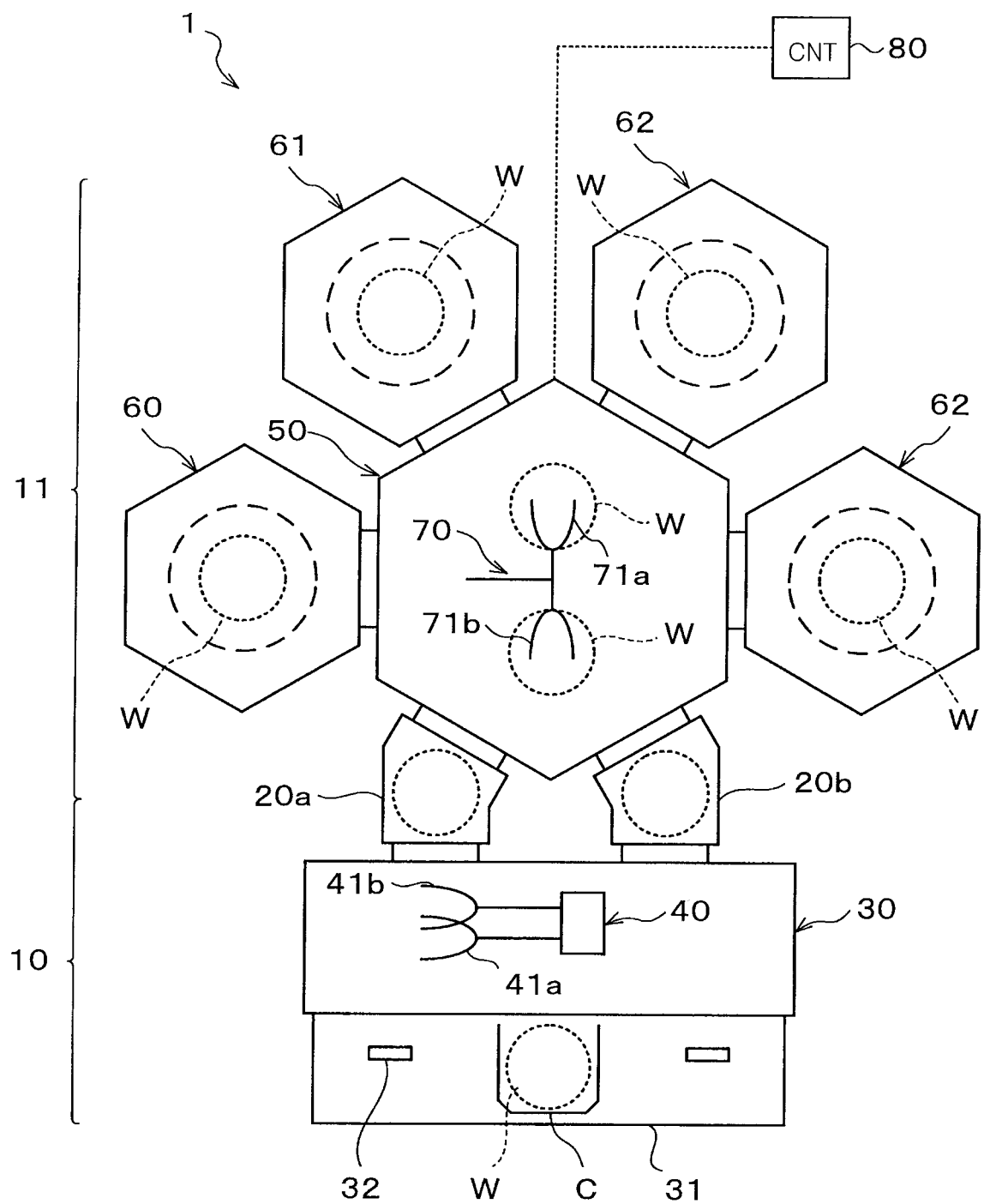
FIG. 3 is a plan view schematically showing an example of a configuration of a wafer processing system.

Next, a configuration of the wafer processing system of the present embodiment for improving loading problem in side etching will be described. FIG. 3 is a plan view schematically showing a configuration of the wafer processing system 1. In the wafer processing system 1 in accordance with the present embodiment, various treatments such as breakthrough (BT) processing, plasma processing, side etching, and the like are performed on a wafer W on which a SiGe layer and a Si layer are alternatingly stacked. Further, the wafer W loaded into the wafer processing system 1 has been subjected to the above-described treatments such that various residuals D remain on the arrangement surface Wn.

The wafer processing system 1 has a structure in which an atmospheric unit 10 and a depressurization unit 11 are integrally connected through load-lock devices 20a and 20b. In the atmospheric unit 10, loading and unloading of a cassette C capable of accommodating a plurality of wafers W is performed. In the depressurization unit 11, the wafer W is subjected to a desired processing under a depressurized condition.

The load-lock device 20a temporarily holds the wafer W to be delivered from an atmospheric pressure transfer device 30 in the atmospheric unit 10 to a depressurization transfer device 50 in the depressurization unit 11. The atmospheric pressure transfer device 30 and the depressurization transfer device 50 will be described later.

A gas supply unit (not shown) for supplying a gas and a gas exhaust unit (not shown) for exhausting a gas are connected to the load-lock device 20a. An inside of the load-lock device 20a can be switched between an atmospheric pressure state and a depressurized state by the gas supply unit and the gas exhaust unit. In other words, the load-lock device 20a is configured to appropriately transfer a wafer between the atmospheric unit 10 in an atmospheric pressure state and the depressurization unit 11 in a depressurized state.

The load-lock device 20b has the same configuration as the load-lock device 20a, and temporally holds the wafer W to be delivered from the depressurization transfer device 50 in the depressurization unit 11 to the atmospheric pressure transfer device 30 in the atmospheric unit 10. The depressurization transfer device 50 and the atmospheric pressure transfer device 30 will be described later.

The number or the arrangement of the load-lock devices 20a and 20b are not limited to that in the present embodiment, and may vary.

The atmospheric unit 10 includes an atmospheric pressure transfer device 30 having a wafer transfer mechanism 40 to be described later, and a cassette station 31 on which a cassette C capable of accommodating a plurality of wafers W is placed.

The atmospheric pressure transfer device 30 comprises a rectangular housing whose inside is hermetically sealed and maintained in an atmospheric pressure state. A cassette station 31 is disposed along the long side of the rectangular housing of the atmospheric pressure transfer device 30. A plurality of, for example, three cassette mounting tables 32 are arranged side by side. The load-lock devices 20a and 20b are arranged side by side along the other long side of the rectangular housing of the atmospheric pressure transfer device 30. The cassette station 31 may be provided with an orienter device (not shown) for adjusting the orientation of the wafer W.

The number or the arrangement of the cassette mounting tables 32 is not limited to that in the present embodiment, and may vary.

A wafer transfer mechanism 40 for transferring the wafer W is disposed in the atmospheric pressure transfer device 30. The wafer transfer mechanism 40 has two transfer arms 41a and 41b, each for holding the wafer W substantially horizontally. Each of the transfer arms 41a and 41b is configured to be horizontally extensible/contractible and rotatable. Further, the wafer transfer mechanism 40 has an elevating unit (not shown) disposed below the transfer arms 41a and 41b. The transfer arms 41a and 41b are configured to be vertically movable by the elevating unit. The wafer transfer mechanism 40 is configured to transfer the wafer W held on any one of the transfer arms 41a and 41b.

The depressurization unit 11 includes the depressurization transfer device 50, a breakthrough (BT) processing apparatus 60, a plasma processing apparatus 61, and etching apparatuses 62. In the present embodiment, two etching apparatuses 62, for example, are provided for the depressurization unit 11.

The depressurization transfer device 50 comprises a housing whose inside can be hermetically sealed, the housing having a polygonal shape (hexagonal shape in the illustrated example) in plan view. The depressurization transfer device 50 is connected to the above-described load-lock devices 20a and 20b. The inside of the depressurization transfer device 50 can be maintained in a desired depressurized atmosphere (vacuum state).

The BT processing apparatus 60, the plasma processing apparatus 61, the etching apparatuses 62, and the load-lock devices 20a and 20b are arranged outside the housing of the depressurized transfer device 50 to surround the housing. The load-lock device 20a, the BT processing apparatus 60, the plasma processing apparatus 61, the etching apparatus 62, the etching apparatus 62, and the load-lock device 20b are arranged in that order in a clockwise direction from the load-lock device 20a in plan view, with each apparatus facing each side of the hexagonal shape housing.

As shown in FIG. 4, the BT processing apparatus 60 removes an oxide (O) among the residuals D remaining after the RIE pre-treatment. Specifically, the oxide (O) remaining on the arrangement surface Wn is removed by supplying a hydrogen fluoride (CF)-based gas (e.g., tetrafluoromethane: $CF_4$) to the arrangement surface Wn on which the residuals D remain.

The plasma processing apparatus 61 modifies residuals D that are not removed by the BT processing among the residuals D remaining after the RIE pre-treatment. In other words, as shown in FIG. 4, for example, the plasma processing modifies the residuals D such as carbon (C), hydrogen fluoride (CF), bromine (Br), chlorine (Cl), and the like. Specifically, surfaces of the residuals D are modified by causing a plasmarized reducing gas, e.g., hydrogen radicals in the present embodiment, to act on the arrangement surface Wn on which the residuals D remain. The "modification" of the residuals D represents, e.g., removal of the residuals D or formation of cracks or small holes on the surfaces of the residuals D. In other words, the "modification" of the residuals D means physical removal or modification of the residuals D remaining on the arrangement surface Wn, thereby facilitating supply of an etching gas to the SiGe layers on the arrangement surface Wn in the etching apparatus 62, which will be described later.

A specific configuration of the plasma processing apparatus 61 will be described later.

The etching apparatus 62 performs side etching of the SiGe layers by supplying a fluorine-based reactive gas, e.g., $ClF_3$, $F_2Cl_3$, $F_2$, or the like, to the wafer W that has been subjected to the removal and the modification of the residuals D by the BT processing and the plasma processing.

The insides of the BT processing apparatus 60, the plasma processing apparatus 61, and the etching apparatus 62 can be maintained in a desired depressurized atmosphere (vacuum state). The number or the arrangement of the BT processing apparatus 60, the plasma processing apparatus 61, and the etching apparatus 62 is not limited to that in the present embodiment, and may vary. In other words, two plasma processing apparatuses 61 may be provided, instead of the etching apparatuses 62, for the depressurization unit 11, for example.

A wafer transfer mechanism 70 for transferring the wafer W is disposed in the housing of the depressurization transfer device 50. The wafer transfer mechanism 70 has two transfer arms 71a and 71b for holding the wafer W substantially horizontally. Each of the transfer arms 71a and 71b is configured to be horizontally extensible/contractible and rotatable. Further, the wafer transfer mechanism 70 has an elevating unit (not shown) disposed below the transfer arms 71a and 71b. The transfer arms 71a and 71b are configured to be vertically movable by the elevating unit. The wafer transfer mechanism 70 is configured to transfer the wafer W held on any one of the transfer arms 71a and 71b.

The above-described wafer processing system 1 is provided with a controller (CNT) 80. The controller 80 is a computer including, e.g., a CPU, a memory, or the like, and has a program storage unit (not shown). The program storage unit stores a program for controlling processing of the wafer W in the wafer processing system 1. Further, the program storage unit stores a program for controlling the operations of the above-described various processing apparatuses or the driving systems such as the transfer devices and the like to realize wafer processing to be described later in the wafer processing system 1. The program may be recorded in a computer-readable storage medium H and installed in the controller 80 from the storage medium H.

<Plasma Processing Apparatus>

Figure 5:
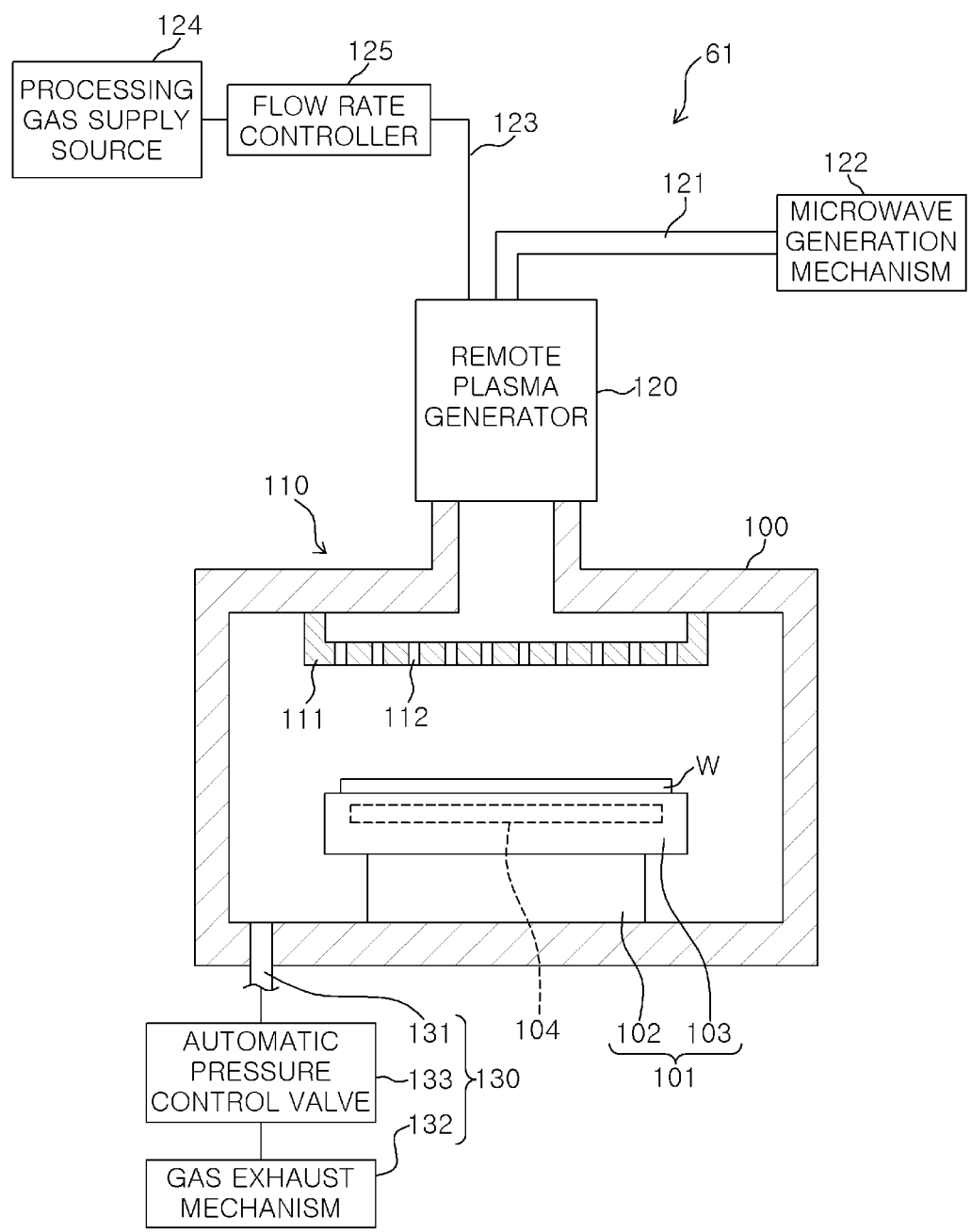
FIG. 5 is a vertical cross-sectional view showing an example of a configuration of a plasma processing apparatus.

Next, a specific configuration of the above-described plasma processing apparatus 61 will be described. FIG. 5 is a vertical cross-sectional view schematically showing a configuration of the plasma processing apparatus 61.

As shown in FIG. 5, the plasma processing apparatus 61 includes a chamber 100 accommodating a wafer W, a mounting table 101 for placing thereon the wafer W in the chamber 100, a gas supply unit 110 for supplying a processing gas into the chamber 100, a remote plasma generator 120 for converting the supplied processing gas into plasma, and a gas exhaust unit 130 for discharging the processing gas in the chamber 100. As described above, a reducing gas is used as an example of the processing gas in the present embodiment.

A loading/unloading port (not shown) for loading/unloading the wafer W is disposed on a sidewall of the chamber 100, and the plasma processing apparatus 61 is connected to the depressurization transfer device 50 through the loading/unloading port. The loading/unloading port can be opened and closed by a gate valve (not shown).

The substrate support 101 includes an upper table 103 for placing thereon the wafer W and a lower table 102 fixed to a bottom surface of the chamber 100 to support the upper table 103. A temperature control mechanism 104 for controlling a temperature of the wafer W is disposed in the upper table 103.

The gas supply unit 110 includes a shower head 111 for supplying a processing gas to the wafer W placed on the mounting table 101. The shower head 111 is disposed on a ceiling surface of the chamber 100 to face the mounting table 101. Gas injection ports 112 for supplying a processing gas is disposed on a bottom surface (shower plate) of the shower head 111.

The remote plasma generator (RPG) 120 for converting a supplied processing gas into plasma is disposed at an upper portion of the chamber 100. A waveguide 121 through which microwaves propagate is connected to the remote plasma generator 120, and is also connected to a microwave generation mechanism 122 for generating microwaves. A microwave generation method is not particularly limited, and a magnetron, exciter, or the like is used.

A processing gas supply source 124 is connected to the remote plasma generator 120 through a processing gas supply line 123.

The number of the processing gas supply source 124 connected to the remote plasma generator 120 is not limited to that in the present embodiment, and may vary. In such case, the processing gas supplied from each processing gas supply source is not limited to a reducing gas only and $N_2$ gas or He gas, for example, may be selected as a processing gas.

The processing gas supply line 123 is provided with a flow rate controller 125 for controlling an opening/closing operation of the processing gas supply line 123 and a flow rate of a processing gas. The flow rate controller 125 has, e.g., an opening/closing valve and a mass flow controller.

The gas exhaust unit 130 includes a gas exhaust line 131 disposed at the bottom portion of the chamber 100 outside the substrate support 101. The gas exhaust line 131 is connected to a gas exhaust mechanism 132 for evacuating the chamber 100. Further, an automatic pressure control valve (APC) 133 is disposed in the gas exhaust line 131. A pressure in the chamber 100 is controlled by the gas exhaust mechanism 132 and the APC 133.

The wafer processing system 1 of the present embodiment is configured as described above. Hereinafter, wafer processing performed by the wafer processing system 1 will be described. As described above, the wafer W loaded into the wafer processing system 1 has been subjected to the above-described pre-treatment, so that various residuals (deposits) D remain on the arrangement surface Wn.

First, a cassette C containing a plurality of wafers W is loaded into the cassette station 31 of the wafer processing system 1 and placed on the cassette mounting table 32. Then, the wafer transfer mechanism 40 takes out one wafer W from the cassette C and transfer the wafer W into the load-lock device 20a.

When the wafer W is loaded into the load-lock device 20a, the load-lock device 20a is sealed and depressurized. When a pressure in the load-lock device 20a becomes lower than an atmospheric pressure (when the load-lock device 20a becomes in a vacuum state), the load-lock device 20a communicates with the depressurization transfer device 50 that has been depressurized to a vacuum state. Then, the wafer W is transferred from the load-lock device 20a to the depressurization transfer device 50 by the wafer transfer mechanism 70.

The wafer W loaded into the depressurization transfer device 50 is transferred to the BT processing apparatus 60 by the wafer transfer mechanism 70.

In the BT processing apparatus 60, an oxide (O)-based residual D among the residuals D adhered to the wafer W during the pre-treatment is removed (BT processing). Specifically, the oxide (O)-based residual D is removed in the form of $CO_2$ or CO by supplying a hydrogen fluoride (CF)-based gas such as $CF_4$ or the like to the residual D remaining on the arrangement surface Wn of the wafer W.

The wafer W that has been subjected to the BT processing in the BT processing apparatus 60 is transferred to the plasma processing apparatus 61 by the wafer transfer mechanism 70.

In the plasma processing apparatus 61, the residuals D that are not removed by the BT processing, i.e., carbon (C), hydrogen fluoride (CF), bromine (Br), chlorine (Cl), and the like, among the residuals D adhered to the wafer W in the pre-treatment, are modified (remote plasma processing). Specifically, a reducing gas, e.g., $H_2$ gas, is supplied from the processing gas supply source to the remote plasma generator 120, and microwaves are supplied from the microwave generation mechanism 122. Accordingly, plasma of the reducing gas is generated in the remote plasma generator 120. The generated plasma contains hydrogen radicals from $H_2O$, $NH_3$, alcohol, or the like. Then, the residuals D are removed in forms of reduced substances by causing the hydrogen radicals in the generated plasma to act on the residuals D remaining on the arrangement surface Wn of the wafer W after the BT processing. Alternatively, cracks and small holes are formed (surface modification) on the surfaces of the residuals D.

The remote plasma processing is performed by generating plasma of a reducing gas containing hydrogen in the remote plasma generator 120, separate from the chamber 100 where the wafer W is disposed, and conveying the generated plasma to the chamber 100. Since ions such as hydrogen ions ($H_2$ ions) and the like are easily deactivated during the conveying to the chamber 100, radical-based processing can be performed using remote plasma. By using radicals, damages to the Si layer, the SiGe layer, and the wafer W can be reduced. A plasma source is not particularly limited, and inductively coupled plasma, microwave plasma, or the like may be used.

The remote plasma processing is performed under the condition that the supplied hydrogen radicals do not damage the Si layer, the SiGe layer, and the wafer W. Specifically, the remote plasma processing is preferably performed under the condition of an output of 300 W to 1000 W and a vacuum level of 0.1 Torr to 1.5 Torr. For example, when the plasma processing is performed with an output higher than the above upper limit value, the generated hydrogen radicals may reach and damage the Si layer, the SiGe layer, and the wafer W. On the other hand, when the plasma processing is performed with an output lower than the above lower limit value, the modification of the residuals D by the generated hydrogen radicals becomes insufficient, which may cause loading in an etching process.

The plasma generated in the plasma processing apparatus 61 is not limited to plasma of a reducing gas in the present embodiment. The plasma may be generated in any manner as long as a film (e.g., an oxide film) that blocks an etching gas in a subsequent etching process is not formed. For example, the plasma may be generated from $N_2$ gas or He gas. As described in the present embodiment, the plasma may be generated from a reducing gas containing hydrogen, and various residuals D shown in Table 3 can be modified by causing hydrogen radicals to act on the residuals D.

The wafer W that has been subjected to the remote plasma processing in the plasma processing apparatus 61 is transferred to the etching apparatus 62 by the wafer transfer mechanism 70.

In the etching apparatus 62, the side etching of the SiGe layers formed on the wafer W after the BT processing and the remote plasma processing are performed. Specifically, the SiGe layers are selectively dry-etched by supplying a fluorine-based reactant gas (etching gas) such as $ClF_3$, $F_2Cl_3$, $F_2$, or the like to the arrangement surface Wn exposed in the pre-treatment.

Here, in the present embodiment, as described above, the BT processing and the remote plasma processing are performed on the residuals D on the arrangement surface Wn prior to the side etching of the SiGe layers. Therefore, various residuals D on the arrangement surface Wn are appropriately removed and/or modified, so that the etching gas appropriately reaches the arrangement surface Wn in the etching apparatus 62. In other words, it is possible to appropriately perform the side etching of the SiGe layers.

Figure 6:
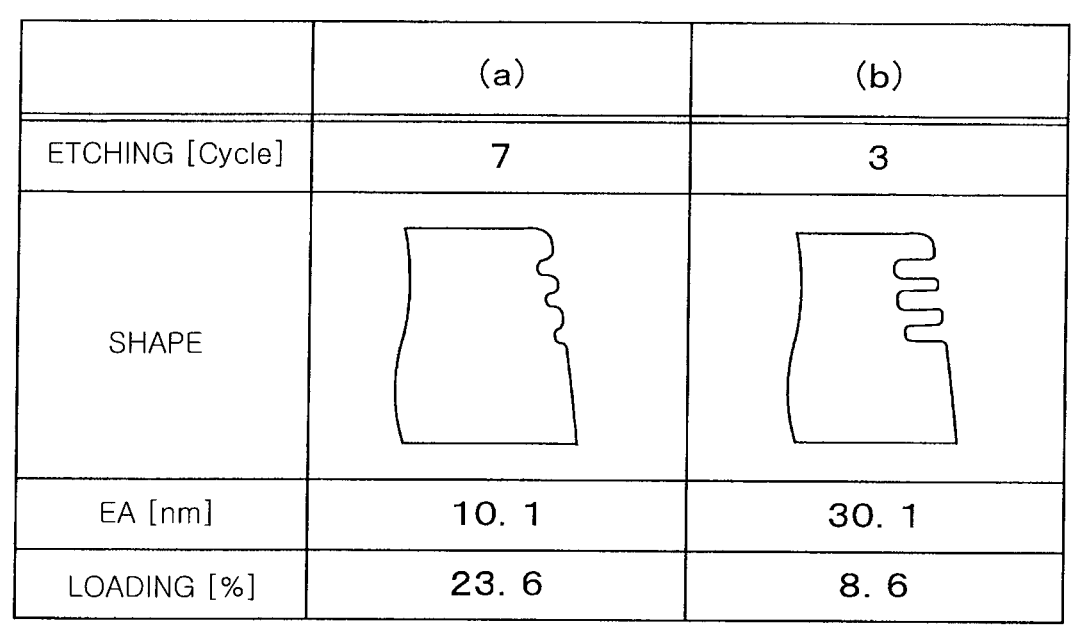

FIG. 6 shows the shapes of the multi-stacked Si/SiGe layers after the side etching of the SiGe layers is performed, in the cases where (a) a remote plasma processing is not performed and (b) a remote plasma processing is performed in accordance with the present embodiment. Case (a) represents the shape when the remote plasma processing was not performed and the etching cycle was repeated seven times and case (b) represents the shape when the remote plasma processing was performed and the etching cycle was repeated three times.

As shown in FIG. 6, when the remote plasma processing was not performed, an etching amount (EA) was 10.1 nm even after repeating the etching cycle seven times, whereas when the remote plasma treatment was performed, an etching amount reached 30.1 nm after repeating the etching cycle three times. Further, the loading was 23.6% when the remote plasma processing was not performed, whereas the loading was 8.6% when the remote plasma processing was performed. In other words, by performing the remote plasma processing prior to the side etching of the SiGe layers, the side etching of the SiGe layers can be appropriately performed and the loading can be improved.

This is because when the remote plasma processing is not performed before the side etching of the SiGe layers of the wafer W as in the conventional case, i.e., when the residuals D are removed only by the BT processing, various residuals D that are not removed by the BT processing remain on the arrangement surface Wn. In other words, although an oxide (O)-based residual D is removed by the BT processing, other residuals D still remain on the arrangement surface Wn. Thus, the movement of the etching gas is hindered by the remaining residuals D. Accordingly, the etching gas does not reach or non-uniformly reaches the SiGe layers on the arrangement surface Wn, which makes it difficult to perform the side etching appropriately.

On the other hand, in the present embodiment, the residuals D other than the oxide (O) are modified by the remote plasma processing. Therefore, when the residuals D are removed, the etching gas directly reaches the arrangement surface Wn. Further, when cracks or small holes are formed on the residuals D, the etching gas reaches the arrangement surface Wn through the cracks and the small holes. Accordingly, the side etching can be appropriately and uniformly performed.

Then, the wafer W that has been subjected to the side etching in the etching apparatus 62 is transferred to the load-lock device 20b by the wafer transfer mechanism 70.

When the wafer W is loaded into the load-lock device 20b, the load-lock device 20b is sealed and pressurized. When the load-lock device 20b becomes in an atmospheric pressure state, the load-lock device 20b communicates with the atmospheric pressure transfer device 30 in an atmospheric pressure state. Then, the wafer W is transferred from the load-lock device 20b to the cassette station 31 by the wafer transfer mechanism 40 and stored in the cassette C. When the wafer processing for all the wafers W in the cassette C is completed and the wafers are stored in the cassette C, the cassette C is unloaded from the wafer processing system 1 and a series of wafer processing is completed.

As described above, in accordance with the present embodiment, the residuals D are removed and/or modified by performing the BT processing and the remote plasma processing prior to the side etching of the SiGe layers, which makes it possible to improve the loading and to appropriately perform the side etching. Specifically, a desired etching amount can be obtained with a smaller number of etching cycles compared to the conventional case of performing only the BT processing, and the loading can be improved.

Further, in accordance with the present embodiment, since the remote plasma processing is performed in the plasma processing apparatus, the generated plasma is suppressed from reaching the Si layer, the SiGe layer and the wafer W, and damages to the Si layer, the SiGe layer and the wafer W are suppressed. Specifically, since the generated hydrogen radicals reach the arrangement surface Wn of the wafer W in a deactivated state, the residuals D can be appropriately modified while suppressing the influence on the Si layer, the SiGe layer, and the wafer W.

Further, in accordance with the present embodiment, since the remote plasma processing is performed with an output of 300 W to 1000 W, it is possible to further appropriately suppress the generated radicals from reaching the Si layer, the SiGe layer, and the wafer W.

In accordance with the present embodiment, since the reducing gas, e.g., $H_2$ gas, is used in the remote plasma processing, it is possible to appropriately modify various residuals D.

In the case of removing various residuals D by wet etching, it is necessary to supply various liquid chemicals such as Sulfuric acid peroxide mixture (SPM), hydrofluoric acid-hydrogen peroxide mixture (FPM), deionized water (DIW), and the like depending on types of residuals D, as shown in FIG. 4. At this time, an additional cleaning process for these liquid chemicals is required in the side etching. However, in the present embodiment, the residuals D can be removed or modified by dry etching such as BT processing, remote plasma processing, or the like, cleaning of liquid chemicals is not required. Further, in the remote plasma processing, various residuals D can be modified by supplying only hydrogen radicals. In other words, the residuals D can be removed or modified more simply compared to the case of performing wet etching.

As shown in FIG. 4, an oxide (O) can be modified, in addition to carbon (C), hydrogen fluoride (CF), bromine (Br), chlorine (Cl), or the like, by using hydrogen radicals. Therefore, in the wafer processing in the wafer processing system 1, the BT processing may be omitted depending on the amount or types of residuals D adhered to the arrangement surface Wn.

Figure 7:
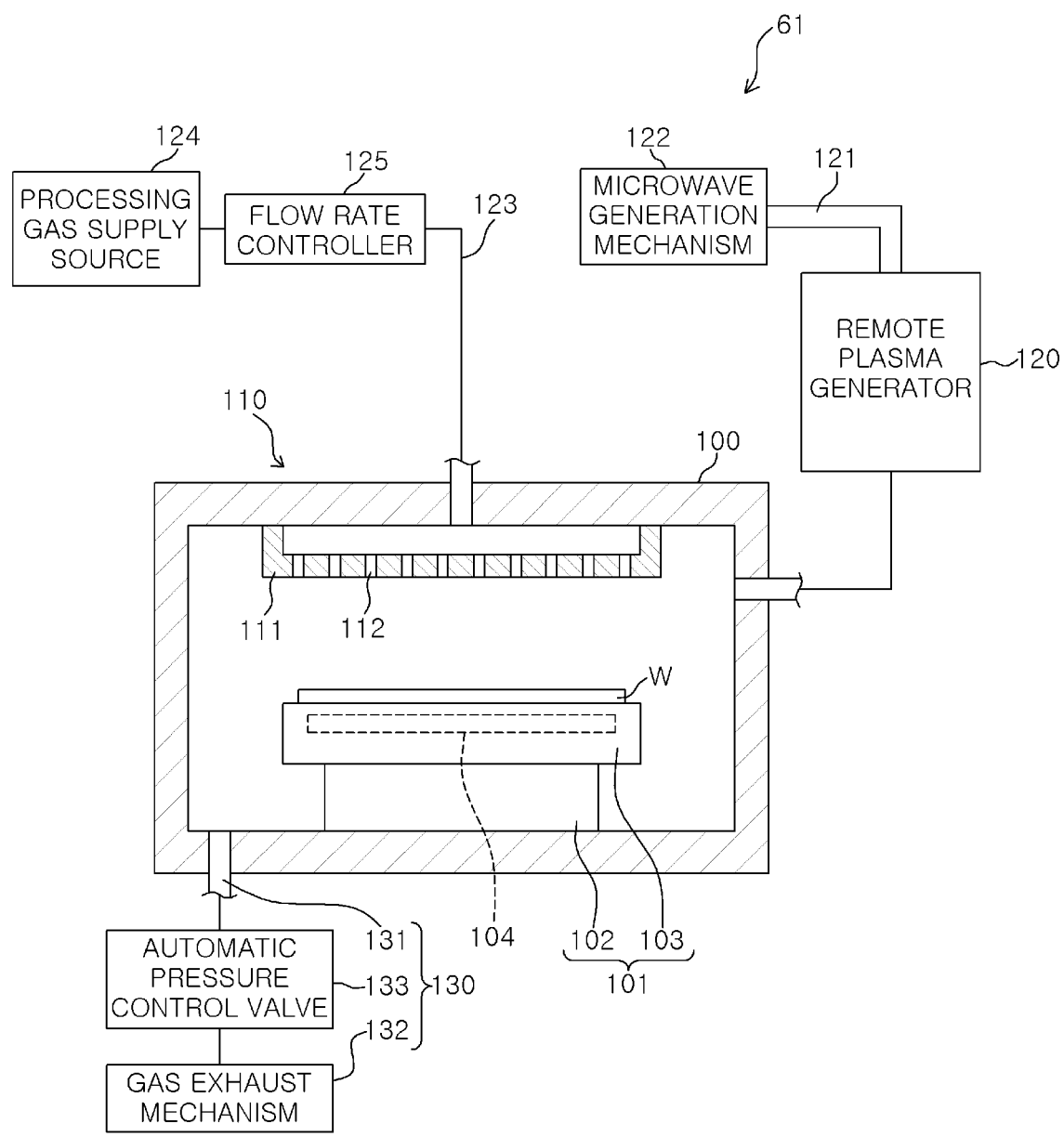
FIG. 7 is a vertical cross-sectional view showing another example of the configuration of the plasma processing apparatus.

In the present embodiment, in the plasma processing apparatus 61, the remote plasma generator 120 is integrally formed with the chamber, i.e., integrally formed with an upper portion of the chamber 100. However, the configuration of the plasma processing apparatus 61 is not limited thereto. For example, as shown in FIG. 7, the remote plasma generator 120 may be provided outside the chamber 100.

In the present embodiment, the case where the processing is performed on the wafer W on which a Si layer and a SiGe layer are alternatingly stacked has been described as an example. However, the structure of the wafer W is not limited thereto. For example, a Si layer and a germanium (Ge) layer may be alternatingly stacked on the surface of the wafer W, or only a Ge layer may be formed on the surface of the wafer.

The embodiments of the present disclosure are illustrative in all respects and are not restrictive. The above-described embodiments can be embodied in various forms. Further, the above-described embodiments may be omitted, replaced, or changed in various forms without departing from the scope of the appended claims and the gist thereof.

The following configurations are also included in the technical scope of the present disclosure.

(1) An etching method for performing side-etching of silicon germanium layers of a substrate having alternating silicon layers and the silicon germanium layers formed thereon, includes modifying surfaces of residuals by supplying a plasmarized gas containing hydrogen to the residuals on exposed end surfaces of the silicon germanium layers; and performing side-etching on the silicon germanium layers by supplying a fluorine-containing gas to the silicon germanium layers.

In accordance with the configuration (1), the surfaces of the residuals (deposits) are modified prior to the side etching of the silicon germanium layers, so that the loading in the side etching can be improved and the side etching can be appropriately performed.

(2) In the etching method of the configuration (1), the gas contains hydrogen radicals.

In accordance with the configuration (2), various residuals can be reduced appropriately by using hydrogen radicals in the plasma processing, so that subsequent side etching can be performed more appropriately.

(3) In the etching method of the configuration (1) or (2), the plasmarization of the gas is performed by a remote plasma generator.

(4) In the etching method of the configuration (3), an output of the remote plasma generator is 300 W to 1000 W.

In accordance with the configuration (4), by controlling the output for plasma generation, damages to the Si layer, the SiGe layer, and the wafer W can be suppressed more appropriately, and the residuals can be modified appropriately.

(5) In the etching method of any one of the configurations (1) to (4), the fluorine-containing gas contains at least one of $ClF_3$, $F_2Cl_3$, or $F_2$.

(6) In the etching method of any one of the configurations (1) to (5), the modifying of the surfaces of the residuals is performed at least before said performing the side etching.

(7) The etching method of any one of the configurations (1) to (6), further includes removing an oxide among the residuals at least before the performing of the side etching.

In accordance with configuration (7), by performing a breakthrough (BT) processing for removing an oxide among the residuals, the residuals can be removed more appropriately. In other words, the side etching of the silicon germanium layers can be more appropriately performed.

(8) A substrate processing system for processing a substrate having alternating silicon layers and silicon germanium layers formed thereon, includes a plasma processing apparatus configured to supply a plasmarized gas containing hydrogen to residuals on exposed end surfaces of the silicon germanium layers; and an etching apparatus configured to perform side-etching of the silicon germanium layers by supplying a fluorine-containing gas to the silicon germanium layers.

(9) In the substrate processing system of the configuration (8), the plasma processing apparatus includes a remote plasma generator configured to plasmarize the gas.

(10) In the substrate processing system of the configuration (9), hydrogen radicals are generated by the plasmarization of the gas.

(11) In the substrate processing system of any one of the configurations (8) to (10), the fluorine-containing gas contains at least one of $ClF_3$, $F_2Cl_3$ or $F_2$.

(12) The substrate processing system of any one of the configurations (8) to (11), further includes a breakthrough apparatus configured to remove an oxide among the residuals.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

What is claimed is:

1. An etching method for performing side-etching of silicon germanium layers of a substrate having alternating silicon layers and the silicon germanium layers formed thereon, comprising:
    modifying surfaces of residuals by supplying a plasmarized gas containing hydrogen to the residuals on exposed side surfaces of the silicon layers and exposed side surfaces of the silicon germanium layers, the residuals being formed during etching of the silicon layers and the silicon germanium layers to expose the side surfaces thereof; and
    performing side-etching on the silicon germanium layers by supplying a fluorine-containing gas to the silicon germanium layers.

2. The etching method of claim 1, wherein the gas contains hydrogen radicals.

3. The etching method of claim 1, wherein the plasmarization of the gas is performed by a remote plasma generator.

4. The etching method of claim 2, wherein the plasmarization of the gas is performed by a remote plasma generator.

5. The etching method of claim 3, wherein an output of the remote plasma generator is 300 W to 1000 W.

6. The etching method of claim 4, wherein an output of the remote plasma generator is 300 W to 1000 W.

7. The etching method of claim 1, wherein the fluorine-containing gas contains at least one of $ClF_3$, $F_2Cl_3$, or $F_2$.

8. The etching method of claim 3, wherein the fluorine-containing gas contains at least one of $ClF_3$, $F_2Cl_3$, or $F_2$.

9. The etching method of claim 1, wherein said modifying the surfaces of the residuals is performed at least before said performing the side etching.

10. The etching method of claim 3, wherein said modifying the surfaces of the residuals is performed at least before said performing the side etching.

11. The etching method of claim 1, further comprising:
    removing an oxide among the residuals at least before said performing the side etching.

12. The etching method of claim 3, further comprising:
    removing an oxide among the residuals at least before said performing the side etching.

13. A substrate processing system for processing a substrate having alternating silicon layers and silicon germanium layers formed thereon, comprising:
    a plasma processing apparatus configured to supply a plasmarized gas containing hydrogen to residuals on exposed side surfaces of the silicon layers and exposed side surfaces of the silicon germanium layers, the residuals being formed during etching of the silicon layers and the silicon germanium layers to expose the side surfaces thereof; and
    an etching apparatus configured to perform side-etching of the silicon germanium layers by supplying a fluorine-containing gas to the silicon germanium layers.

14. The substrate processing system of claim 13, wherein the plasma processing apparatus includes a remote plasma generator configured to plasmarize the gas.

15. The substrate processing system of claim 14, wherein hydrogen radicals are generated by the plasmarization of the gas.

16. The substrate processing system of claim 13, wherein the fluorine-containing gas contains at least one of $ClF_3$, $F_2Cl_3$, or $F_2$.

17. The substrate processing system of claim 14, wherein the fluorine-containing gas contains at least one of $ClF_3$, $F_2Cl_3$ or $F_2$.

18. The substrate processing system of claim 13, further comprising:
    a breakthrough apparatus configured to remove an oxide among the residuals.

19. The substrate processing system of claim 14, further comprising:
    a breakthrough apparatus configured to remove an oxide among the residuals.

* * * * *